United States Patent
Huang et al.

(10) Patent No.: US 7,052,939 B2
(45) Date of Patent: May 30, 2006

(54) STRUCTURE TO REDUCE SIGNAL CROSS-TALK THROUGH SEMICONDUCTOR SUBSTRATE FOR SYSTEM ON CHIP APPLICATIONS

(75) Inventors: Wen Ling M. Huang, Scottsdale, AZ (US); Sushil Bharatan, Gilbert, AZ (US); Carl Kyono, Tempe, AZ (US); David J. Monk, Gilbert, AZ (US); Kun-Hin To, Gilbert, AZ (US); Pamela J. Welch, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/304,493

(22) Filed: Nov. 26, 2002

(65) Prior Publication Data

US 2004/0099878 A1 May 27, 2004

(51) Int. Cl.
*H01L 29/76* (2006.01)

(52) U.S. Cl. .................. 438/146; 438/197; 438/220; 438/221

(58) Field of Classification Search .......... 438/146, 438/197, 220, 221; 257/347–556, 374, 315, 257/574
See application file for complete search history.

(56) References Cited

U.S. PATENT DOCUMENTS

| | | | |
|---|---|---|---|
| 5,708,287 A | | 1/1998 | Nakagawa et al. |
| 5,717,241 A | * | 2/1998 | Malhi et al. ............ 257/378 |
| 5,994,741 A | * | 11/1999 | Koizumi et al. |
| 5,994,755 A | * | 11/1999 | Dejong et al. |
| 6,051,868 A | | 4/2000 | Watanabe et al. |
| 6,242,793 B1 | * | 6/2001 | Colombo et al. |

FOREIGN PATENT DOCUMENTS

| EP | 0 271 232 A1 | 6/1988 |
|---|---|---|
| EP | 0 948 054 A2 | 10/1999 |

OTHER PUBLICATIONS

Kuntal Joardar, "A Simple Approach to Modeling Cross–Talk in Integrated Circuits," J.Sol.State Circuits, vol. 29, No. 10, Oct. 1994.
Ivan To et al., "Comprehensive Study of Substrate Noise Isolation for Mixed–Signal Circuits," IEDM, 2001.
M. Huang, et al, "TFSOI—Can It Meet the Challenge of Single Chip Portable Wireless Systems?," IEEE SOI Conference, Oct. 1997.
J.S. Hamel, "Substrate Cross–Talk Suppression Capability of Silicon–on Insulator Substrates with Burried Ground Planes (GPSOI)," IEEE Microwave and Guided Waves Letters. vol., 10, No. 4, Apr. 2000.
PCT Search Report, PCT/US03/36563 mailed May 11, 2004.

* cited by examiner

*Primary Examiner*—Fetsum Abraham

(57) ABSTRACT

A structure that reduces signal cross-talk through the semiconductor substrate for System-On-Chip (SOC) (2) applications, thereby facilitating the integration of digital circuit blocks (6) and analog circuit blocks (8) onto a single IC. Cross-circuit interaction through a substrate (4) is reduced by strategically positioning the various digital circuit blocks (6) and analog circuit blocks (8) in an isolated wells (10), (12), (16) and (20) over a resistive substrate (4). These well structures (10), (12), (16), and (20) are then surrounded with a patterned low resistivity layer (22) and optional trench region (24). The patterned low resistivity region (22) is formed below wells (10) and (12) and functions as a low resistance AC ground plane. This low resistivity region (22) collects noise signals that propagate between digital circuit blocks (6) and analog circuit blocks (8).

13 Claims, 4 Drawing Sheets

STRUCTURE TO REDUCE SIGNAL CROSS-TALK THROUGH SEMICONDUCTOR SUBSTRATE FOR SYSTEM ON CHIP APPLICATIONS

TECHNICAL FIELD OF THE INVENTION

The present invention relates to the field of integrated circuits and, more particularly, to a structure that reduces signal cross-talk through the semiconductor substrate for system on chip applications.

BACKGROUND OF THE INVENTION

Recent advancements in the ability to integrate microelectronic chips has led to a paradigmatic change in circuit system design. Through Very Large Scale Integration (VLSI), and Ultra Large Scale Integration (ULSI), it is now possible to fabricate tens and hundreds of millions of chips onto a single semiconductor wafer. These advancements in integration technology and manufacturing have facilitated the creation of Systems-On-Chips (SOC). Previously, the creation of an electronic system required the integration of several microchips and discrete electronic components on to a Printed Circuit Board (PCB). However, with an SOC, all of these separate microchips and discrete electronic components are integrated onto a single microchip. An SOC will contain a large range of electronic devices including Central Processing Units (CPUs), random logic, memory, digital, and analog circuitry.

SOCs have significant advantages over electronic systems created on boards with discrete components. One advantage is size. An integrated circuit having an SOC is much smaller than a circuit board based system. Both transistors and interconnect wires are reduced to micrometer sizes, in contrast to the millimeter or centimeter scales of discrete components. Through using an SOC, it is possible to improve the overall size and portability of electronic devices.

The reduction in size afforded by SOCs also leads to improvements in power consumption and device speed. Circuit operations that occur on a single integrated circuit require much less power than a similar circuit implemented on a PCB with discrete components. Through using less power, SOCs are highly desirable for portable electronic devices. With respect to device speed, signals are transmitted at far greater speeds within a single chip than within a PCB. The speed of signals within a single microchip is hundreds of times faster than on a PCB. Both the power consumption and speed of an SOC is owed to the smaller parasitic capacitances and resistances of devices fabricated on a single IC.

Replacing electronic circuits supported on a PCB with an SOC greatly reduces cost. Reducing the number of discrete electronic components, lowering power supply requirements, and placing electronic system components onto a single IC leads to cost reductions in the electronic system.

Cost effective SOC design requires the use and integration of pre-designed blocks. Through creating pre-designed general purpose circuit blocks, commonly referred to as Intellectual Property (IP) blocks, it is possible to reduce the time to design an SOC. These IP blocks can include digital blocks, analog blocks, RF blocks, CPU blocks, memory blocks, and random logic blocks.

Today, mixed-signal circuits constitute an important part of integrated circuits. Many applications require both analog front end systems and digital processing blocks. The integration, however, of these various digital and analog circuit blocks into an SOC presents several unique problems. For example, placing each of these various circuit block types on a single IC often allows inter-circuit interaction through the IC substrate. Such interaction can greatly degrade and inhibit the expected operation of the SOC when digital and analog elements are placed on the same substrate.

The differential noise sensitivity of dissimilar circuit types spawns another problem. Analog circuitry is sensitive to electrical noise produced by other circuits and devices. This sensitivity to noise makes it desirable to isolate analog circuitry from sources of electrical noise. On the other hand, digital circuits are far less sensitive to electrical noise due to their digital nature. The low voltage swing of an analog device produces little noise. Further, the current bases for analog circuitry keeps noise levels low. Consequently, analog circuits produce low noise levels. However, digital circuits produce a significant amount of electrical noise due to the large rail to rail voltage swings of the devices. Integrating analog and digital circuit elements onto a single IC typically exposes the analog circuit elements to the high noise component produced by the digital circuit elements. To integrate analog and digital circuit components on a single IC, analog circuit components must be isolated and insulated from the electrical noise produced by digital circuit components.

Signal crosstalk also plagues dissimilar device circuitry. Crosstalk is interference caused by two or more signals becoming partially superimposed on each other due to electromagnetic (inductive) or electrostatic (capacitive) coupling between devices or conductors carrying the signals. In MOS circuits, this interference between devices can produce false switching in other parts of the system. Consequently, it is highly desirable to develop an IC that can support analog and digital components while reducing crosstalk and noise to ensure high performance and reliability.

SUMMARY OF THE INVENTION

The present invention provides a semiconductor structure that facilitates the integration of digital and analog circuits into a single IC for System-On-Chip (SOC) applications. More specifically, the present invention provides a structure that reduces the unwanted electrical interaction of digital circuits and analog circuits on a single IC through the substrate. Such unwanted electrical interaction includes the transmission of noise and signal cross-talk. The present invention reduces cross-circuit interaction through the substrate by strategically positioning the various components in an isolated well structure over a resistive region. These well structures are then surrounded with a patterned low resistivity layer that forms a low resistance AC ground plane. This patterned low resistivity layer forms a ring around the well structure and is buried within the substrate. In addition, the isolated well structure can also be surrounded by an optional trench structure.

The strategic placement of the circuit components with these various isolation structures functions to reduce noise and signal cross-talk in SOCs. The isolated wells and resistive regions function to inhibit the propagation of unwanted signals between devices. Further, the buried low resistivity region collects any noise signals that leak through the isolated well structure.

DETAILED DESCRIPTION OF A PREFERRED EMBODIMENT

Figure 1:
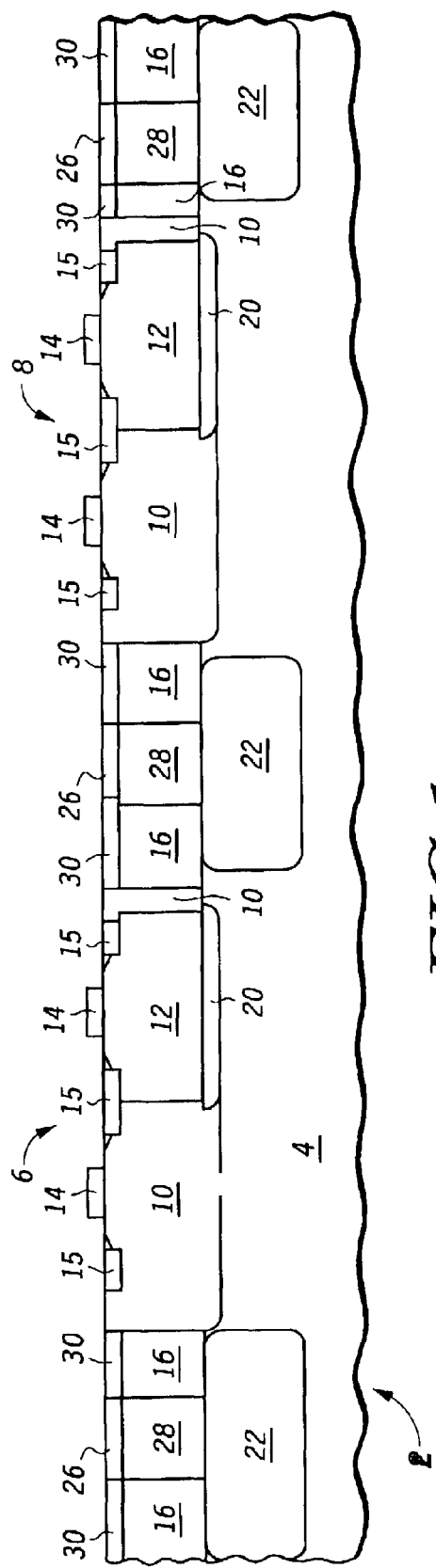
FIG. 1 illustrates a present preferred embodiment of the invention implemented over a bulk semiconductor.

Referring to the Figures by characters of reference, FIG. 1 illustrates a present preferred embodiment of the invention. A System-On-Chip (SOC) 2 is illustrated in FIG. 1. SOC 2 is fabricated on a substrate 4. SOC 2 contains a large range of electronic devices including Central Processing Units (CPUs), random logic, memory, digital, and analog circuitry. In FIG. 1, a section of SOC 2 is illustrated and depicted as having a digital IP circuit block 6 and an analog IP circuit block 8. Digital IP circuit block 6 is implemented using MOS devices. Analog IP circuit block 8 can be implemented using MOS devices, Bipolar devices, or a combination of both. An n-type MOS device formed in an N well 10 is placed next to a p-type MOS device formed in an isolated P well 12 may, for example, be used to form CMOS devices.

Parasitics inherent in SOC 2 are known to cause undesirable signal cross-talk between different sections of SOC 2. Crosstalk is interference caused by two or more signals becoming partially superimposed on each other due to electromagnetic (inductive) or electrostatic (capacitive) coupling between devices or conductors carrying the signals. This cross-talk can lead to device failure in analog block 8 and digital block 6. Cross-talk in SOC 2 occurs through interactions between several parts of SOC 2 such as bond wires and metal lines. Electrical coupling between circuit blocks 6 and 8 on SOC 2 can also lead to signal cross-talk. Analog block 8 is exposed to the electrical noise produced by digital block 6 through substrate 4. Substrate 4 electrically acts as a resistor/capacitor network interconnecting all of the devices on SOC 2 together. Substrate 4 provides a medium through which noise and signals can propagate between blocks 6 and 8 leading to signal cross-talk.

Application of a voltage pulse to a MOSFET gate 14 can lead to unwanted signal cross-talk. Applying a voltage pulse to gate 14 pushes charge into substrate 4 due to a capacitive effect. The result is a current transient though substrate 4. Any impedance that this current encounters in substrate 4 causes potential fluctuations that are felt elsewhere on substrate 4. Current transients in substrate 4 arise from not only MOSFETs in wells 10 and 12, but also when a device connected to substrate 4, such as the collector-substrate junction in an npn transistor, is pulsed. Note that FIG. 1 also illustrates the source/drain regions 15 of MOSFETs in wells 10 and 12. MOSFETs in FIG. 1 include source/drain regions 15 and gate 14 formed in either an N well 10 or isolated P well 12.

The present invention provides a structure that facilitates the integration of digital block 6 and analog block 8 onto SOC 2. More specifically, the present invention provides a structure that reduces the unwanted electrical interaction of digital block 6 and analog block 8 on a single SOC 2 through substrate 4. Such unwanted electrical interaction includes the transmission of noise and signal cross-talk. The present invention reduces cross-circuit interaction through substrate 4 by strategically positioning digital blocks 6 and analog blocks 8 in either P wells 12 and 16, N well 10, or deep N well 20. In addition, digital blocks 6 and analog blocks 8 are formed over a resistive substrate 4. These well structures 10, 12, 16, and 20 are then surrounded with a patterned low resistivity layer 22 that forms a low resistance AC ground plane. This patterned low resistivity layer 22 forms a ring around well structure 10, 12, 16, and 20 and is buried within the interior of substrate 4. In addition, isolated well structures 10, 12, 16, and 20 can also be surrounded by an optional trench structure 24 depicted in FIG. 3.

Analog IP circuit block 8 is sensitive to electrical noise produced by other circuits and devices, such as digital IP circuit block 6. On the other hand, digital IP circuit block 6 is far less sensitive to electrical noise due to its digital nature. The low voltage swing of analog IP circuit block 8 produces little noise. Further, the current bases for analog IP circuit block 8 keeps noise levels low. Consequently, analog IP circuit block 8 produces low noise levels. However, digital IP circuit block 6 produces a significant amount of electrical noise due to the large rail to rail voltage swings of the devices. Integrating analog and digital IP circuit block 6 and 8 onto a single SOC 2 typically exposes analog IP circuit block 8 to the high noise component produced by the digital IP circuit block 6.

Analog and digital blocks 6 and 8 rest on resistive substrate 4. Resistive substrate 4 functions to reduce the transmission of noise and occurrence of signal cross-talk between blocks 6 and 8 through attenuating the transmission of noise and signals as a result of its resistivity. Further, blocks 6 and 8 are additionally isolated using P wells 12 and 16, N well 10, or deep N well 20 to inhibit the transmission of noise and signals between blocks 6 and 8. Placing blocks 6 and 8 within P wells 12 and 16, N well 10, or deep N well 20 over resistive substrate 4 inhibits noise injection into substrate 4. Consequently, signal cross-talk between blocks 6 and 8 is reduced. As a result, the operation of blocks 6 and 8, analog block 8 in particular, is improved. Resistive substrate 4 has a resistance on the order of one ohm-cm to thousand ohm-cm. The choice of resistivity depends on SOC 2 operating frequency.

Circuit blocks 6 and 8 are surrounded by patterned low resistance region 22. Note that region 22 is buried beneath the surface of substrate 4 within the interior of substrate 4. In addition, region 22 forms a ring that surrounds various circuit blocks 6 and 8 individually. Region 22 functions as a low resistance AC ground plane. Through forming region 22 into a ring that surrounds blocks 6 and 8, region 22 is positioned to effectively isolate blocks 6 and 8 from each other. Region 22 collects noise signals produced by blocks 6 and 8 that leak through P wells 12 and 16, N well 10, or deep N well 20. Region 22 acts as a noise sink for noise and signals produced by noisy digital block 6, thereby isolating analog block 8 from noise and signals generated by digital block 6. Noise and signals produced by digital block 6 that are collected by region 22 are taken out of SOC 2 through clean ground contacts 26 that are coupled to region 22 through vias 28. In this manner, region 22, contacts 26, and vias 28 function to remove noise from SOC 2, thereby making SOC 2 electrically more quiet and reducing signal cross-talk. Through providing a low resistance path to ground, region 22 extracts errant electrical signals from substrate 4. As a result of this extraction, the number of potential fluctuations in substrate 4 caused by these errant signals is reduced. Consequently, the occurrence of signal cross talk between circuits 6 and 8 is reduced. Note that contact 26 is electrically connected to region 22 through the use of vias 28 that are formed with an implant, or polysilicon, or other interconnect material.

For a p-type substrate 4, low resistivity layer 22 is a patterned p+ buried layer. Similarly, for an n-type substrate 4, low resistivity layer 22 is a patterned n+ buried layer. The formation of the highly doped patterned buried layer can be achieved by high energy ion implantation. To act as an effective AC ground, region 22 preferably has a resistance of less than 300 ohm per square. The ability of region 22 to function as an effective AC ground is enhanced as the resistivity of the material forming region 22 is reduced. Referring again to FIG. 1, SOC 2 is also provided with shallow trench isolation 30 to isolate and insulate the various components of SOC 2 from each other.

Figure 2:
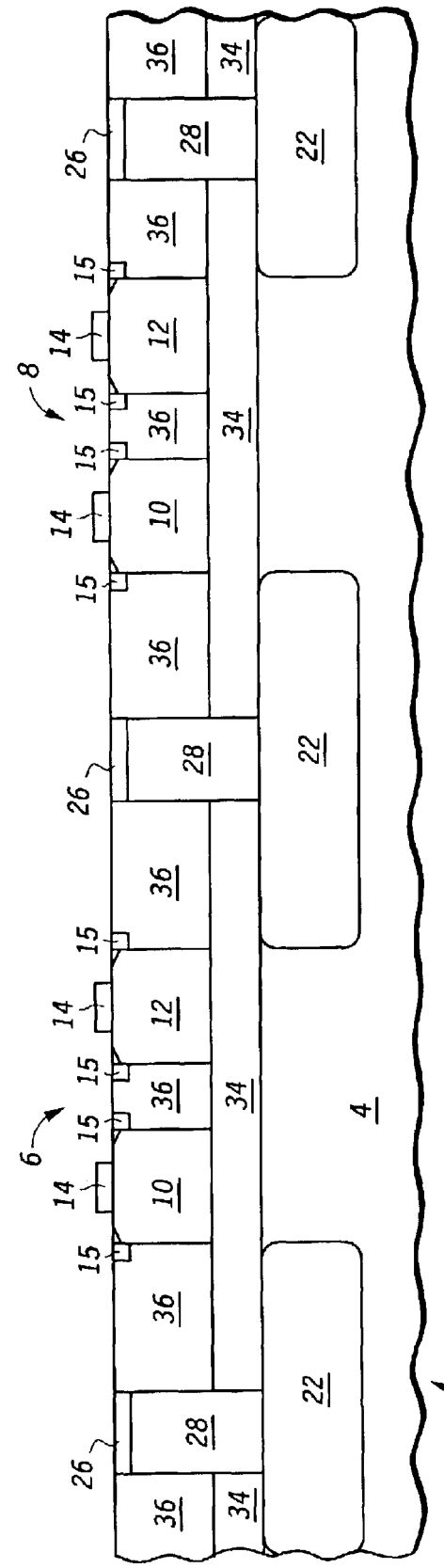
FIG. 2 illustrates a present preferred embodiment of the invention implemented over a Semiconductor-On-Insulator (SOI) structure.

FIG. 2 illustrates a side view of a present preferred embodiment of the invention implemented over a Semiconductor-On-Insulator (SOI) structure. The SOI structure depicted in FIG. 2 has MOS devices that include source/drain regions 15 and gate 14 within N wells 10 and isolated P wells 12 formed over an insulating layer 34 on top of a resistive substrate 4. Insulating layer 34 is illustrated as an oxide. Other exemplary dielectric materials for insulating layer 34 include sapphire, spinel, and nitride.

There are numerous advantages afforded through the use of an SOI based structure for SOC 2. The dielectric isolation of individual circuit blocks 6 and 8 made possible with SOI reduces parasitic capacitances, gives rise to higher operating speeds, and effectively eliminates latch-up. Latch-up is a condition where digital MOS blocks become "stuck" in a specific logic state. As a result, a digital MOS device that is held in a specific logic state by latch-up cannot function normally. In addition, latch-up can lead to a regenerative current that can permanently damage MOS devices in analog block 6. Consequently, the overall digital MOS arrays begin to malfunction. Simply stated, latch-up is caused by an internal feedback mechanism associated with parasitic PNPN-like action. Finally, SOI-based MOSFETs also consume less power, operate at higher temperatures, provide improved radiation hardness, and exhibit reduced short-channel effects.

Referring again to FIG. 2, SOC 2 is illustrated including patterned low resistance region 22 surrounding digital and analog blocks 6 and 8. Again, note that region 22 is buried within the interior of substrate 4 below layer 34. Region 22 forms a ring around blocks 6 and 8 individually. Patterned low resistance region 22 forms an AC ground plane that collects noise and signals that leak through insulating layer 34, especially as current operating frequencies increase into the GHz range. These collected noises and signals are then removed from SOC 2 by clean ground contacts 26. Through collecting the leaked noise and signals from blocks 6 and 8, region 22 and contacts 26 function to make SOC 2 more quiet. Consequently, the operation of blocks 6 and 8, analog block 8 in particular, is improved. To further insulate and isolate blocks 6 and 8 from each other and other devices on SOC 2, oxide isolation regions 36 are provided between them.

Substrate 4 has a resistivity on the order of one ohm-cm to thousand ohm-cm. Through providing substrate 4 with this level of resistivity, substrate 4 attenuates the transmission of noise and signals that leak from digital block 6. As a result, substrate 4 reduces the amount of cross-talk occurring in SOC 2 and isolates analog blocks 8. Consequently, substrate 4 and patterned low resistance region 22 function to reduce the level of noise and cross-talk occurring in SOC 2, thereby increasing the operability of SOC 2.

Insulating layer 34 acts as a barrier between buried layer 22 and MOS devices that include source/drain regions 15, gates 14, and N wells 10 and isolated P wells 12. The presence of insulating layer 34 makes it possible to utilize metal as a material for buried layer 22. Insulating layer 34 prevents any interaction between metal buried layer 22 and MOS devices that include source/drain regions 15, gates 14, and N wells 10 and isolated P wells 12. When using SOI based structure, metals such as, for example, copper, aluminum, or metal silicide such as tungsten silicide forms low resistivity patterned buried layer 22. Alternatively, an implant process could also create low resistivity region 22. It is highly desirable to use a metal to form buried layer 22 due to the low resistivity of metal of less than 100 ohm-cm. The low resistivity of metal increases the ability of buried layer 22 to collect and remove carriers propagating through substrate 2, thereby reducing the level of noise and signal cross-talk in SOC 2.

Figure 3:
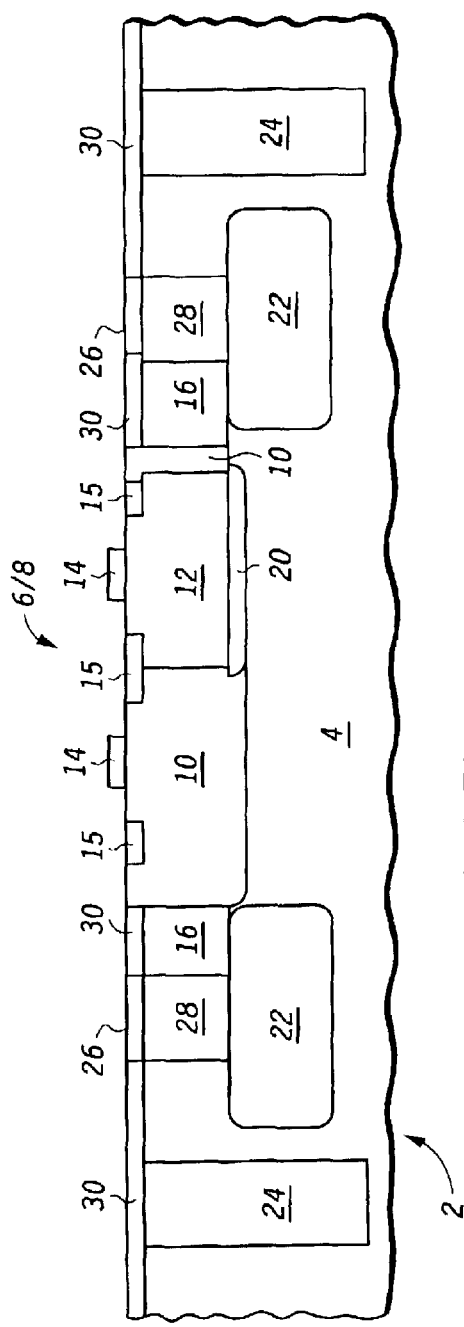
FIG. 3 illustrates a present preferred embodiment of the invention implemented with a deep trench.

FIG. 3 illustrates a present preferred embodiment of the invention implemented with a deep trench 24. Referring to FIG. 3, SOC 2 includes MOS devices that have source/drain regions 15, gates 14, and N wells 10 and isolated P wells 12. These MOS devices are further isolated through the use of P wells 16 and deep N well 20. In addition, SOC 2 is provided with patterned low resistance region 22. Note that region 22 is buried beneath the surface of substrate 4 within the interior of substrate 4 under wells 10 and 12. In addition, region 22 forms a ring that surrounds the MOSFETs formed in wells 10 and 12. MOSFETs formed in wells 10 and 12 form a circuit block 6/8, which could either be a digital block 6 or analog block 8. Region 22 functions as a low resistance AC ground plane. Together, structures 10, 12, 16, 20, and 22 combined with resistive substrate 4 reduce noise propagation and signal cross-talk in SOC 2. Trench 24 provides SOC 2 with an additional capability to reduce noise propagation and signal cross-talk.

Trench 24 is usually, but not necessarily formed through depositing an oxide/nitride layer on the top surface of SOC 2 to protect it from a following Reactive Ion Etch process (RIE). The oxide/nitride layer is a hard mask. As an alternative to using a hard mask, a resist mask can be used. A photolithographic process opens a window in oxide/nitride layer for the formation of trench 24. The RIE process then forms trench 24 in substrate 4. The oxide/nitride layer is then stripped from SOC 2. This etching process also creates surface states along the sidewalls of trench 24. However, a thermal side-wall oxidation reduces the dangling crystalline bonds that produce these surface states. In a preferred embodiment, a dielectric material is then deposited in trench 24. However, in an alternative embodiment, poly-silicon is deposited in trench 24 in place of the dielectric material. Formation of trench 24 preferably occurs prior to the formation of the various circuits on substrate 4, such as blocks 6 and 8.

The presence of deep trench has a several-fold effect on the transmission of noise and signals through the substrate 4. Trench 24 physically occupies the area that is the shortest and most direct path between circuit block 6/8 and a neighboring circuit block. This aspect can be seen, for example, in a top down view of FIG. 5. Adding trench 24 to substrate 4 introduces an additional capacitor into the RC network, thereby increasing the overall impedance of the signal path between block 6/8 and other blocks. This increased impedance further attenuates the transmitted noise between block 6/8 and other blocks. Trench 24 provides additional signal isolation capabilities to isolated P wells 12 and 16, N well 10, Deep N well 20, and buried layer 22. Trench 24 is useful where patterned low resistive region 22 does not completely capture all the transmitted noise and signals between block 2 and neighboring blocks. The addition of trench 24 to buried layer 22 can lead to a greater than 10 db improvement in the noise transmission within SOC 2 out to 10 GHz.

Figure 4:
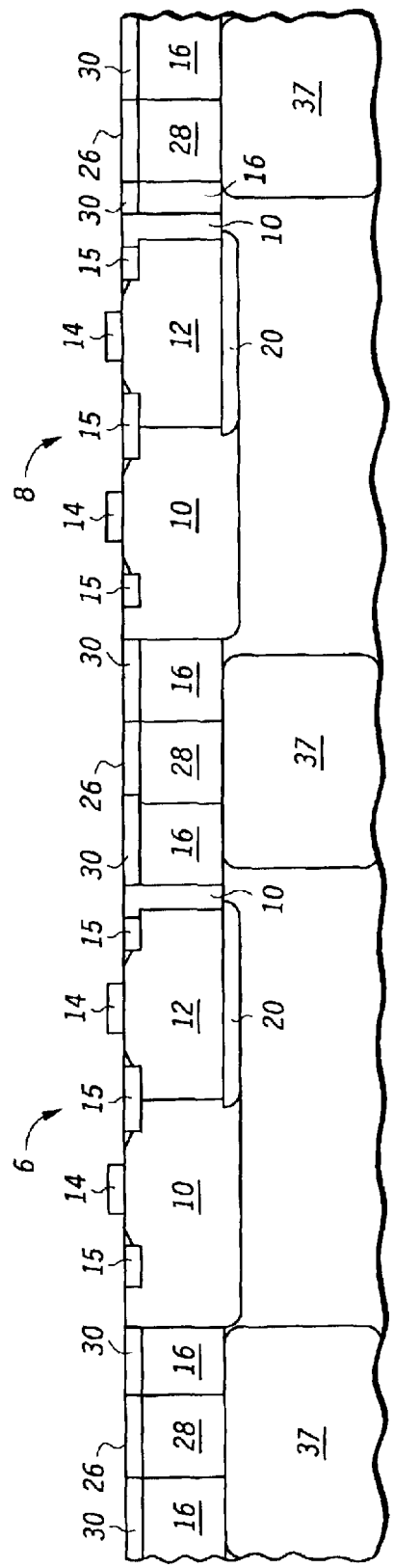
FIG. 4 illustrates a present alternative embodiment of the invention having a patterned low resistivity region formed down to a lower surface of a substrate.

FIG. 4 illustrates a present alternative embodiment of the invention having a patterned low resistivity region 36 formed all of the way down to a bottom surface of a substrate 4. Having patterned low resistivity region 22, shown in FIG. 1, formed partially down toward bottom surface of substrate 4 is preferred due to its ease of manufacture. However, in not having patterned low resistivity region 22 extend all of the way toward the back surface of substrate 4 in the preferred embodiment, carriers are able to travel in the space between region 22 and back surface and propagate through substrate 4 causing signal cross-talk. To maximize the ability of region 22 to intercept and collect carriers propagating through substrate 4, it is desirable to have region 22 extend all of the way toward bottom surface of substrate 4, for example as illustrated as region 36 in FIG. 4. Through having patterned low resistivity region 36 extend all of the way toward back surface of substrate 4, an increased amount of carriers propagating in substrate 4 will interact with region 36. As a result, region 36 is in a position to collect and extract a maximum amount of carriers propagating through substrate 4. Consequently, region 36 is able to increase the amount of reduction in noise propagation and signal crosstalk through substrate 4.

Figure 5:
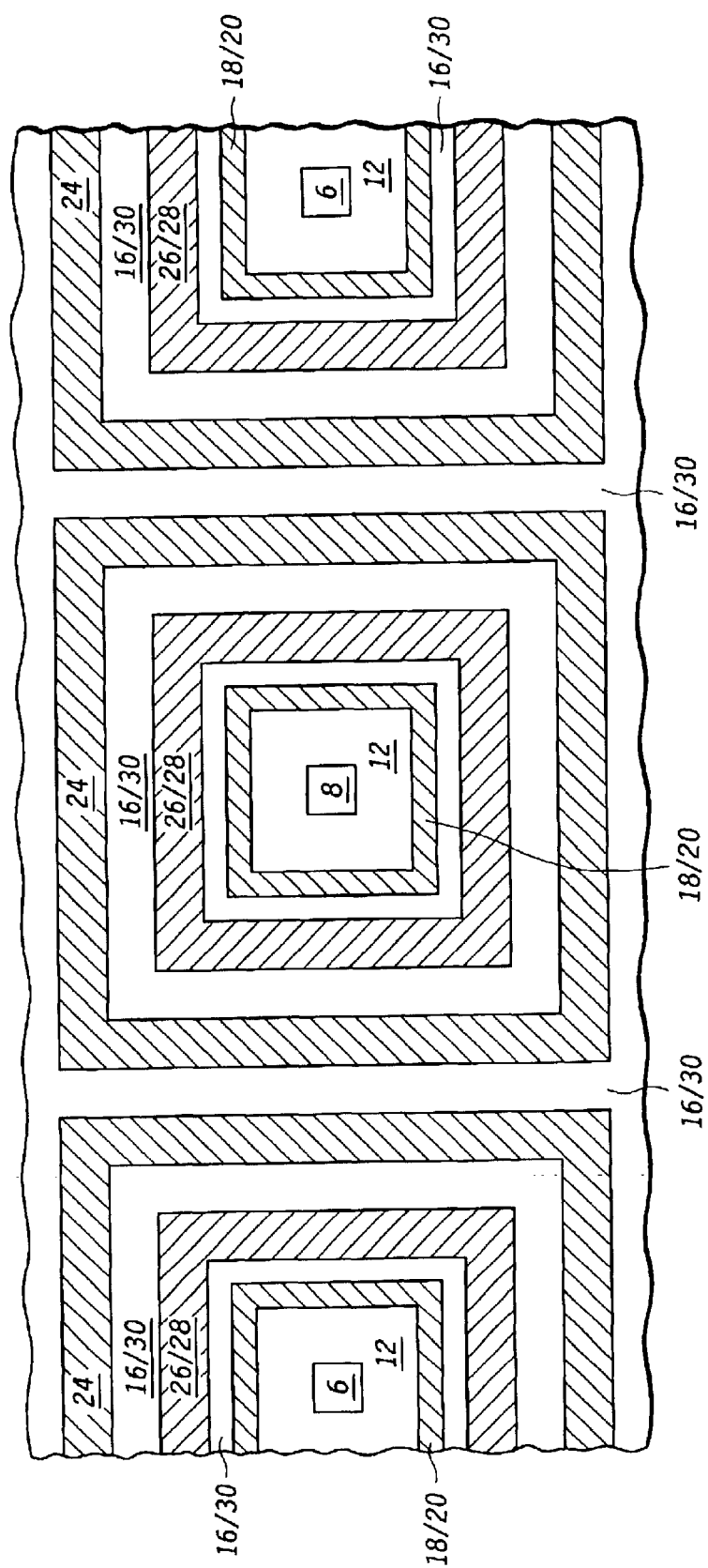
FIG. 5 illustrates a top view present preferred embodiment of the invention.

FIG. 5 illustrates a top view of a present preferred embodiment of the invention. Illustrated in this figure is analog block 8, surrounded by low resistivity patterned buried layer 22. Contacts 26 are formed coupled buried layer 22. Contacts 26 extract the signals and carriers that are collected by buried layer 22. Through surrounding buried layer 22, trench 24 provides additional noise and signal isolation. In between buried layer 22 and trench 24 is shallow trench isolation 30. Analog block 8 is surrounded by P wells 16 and N well 10/20. Carriers that are emitted from digital blocks 6 into substrate 4 are noise and can lead to signal cross-talk. The combination of trench 24, low resistivity buried region 22, and wells 12, 16, 10 and 20 function to protect analog block 8 from the noise of digital blocks 6 and reduce the occurrence of signal cross talk.

Trench 24 physically occupies the area that is the shortest and most direct path between circuit block 8 and digital blocks 6 and increases the overall impedance of the signal path between blocks 6 and 8. Region 22, due to its low resistivity, acts as a sink for carriers propagating in substrate 4. P wells 12 and 16 and N wells 10 and 20 function to inhibit the propagation of carriers between analog block 8 and the remainder of SOC 2 through substrate 4. Substrate 4, due to its inherent resistivity, attenuates the errant signals and noise propagating through it. As a result, these structures reduce the amount of noise and occurrence of cross-talk in SOC 2.

Figure 6:
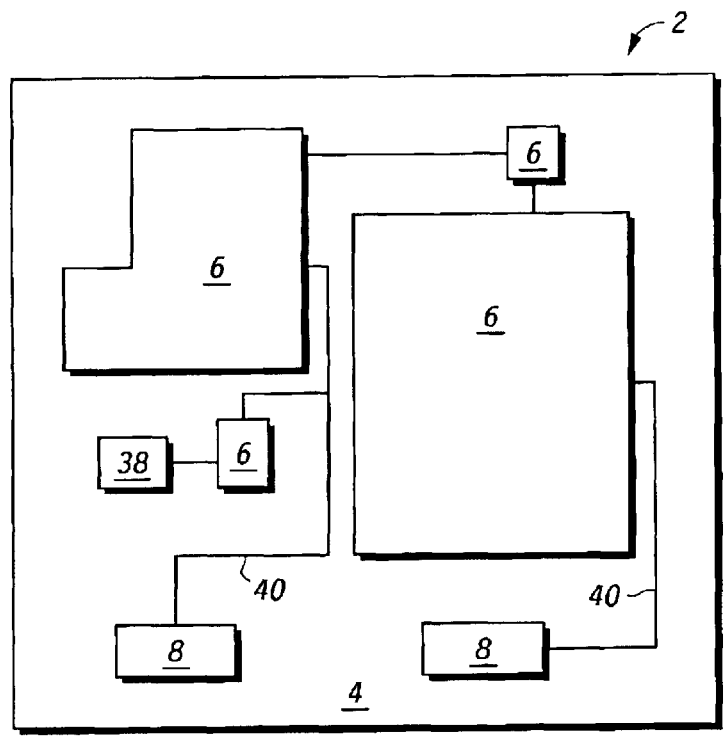
FIG. 6 illustrates a System-On-Chip (SOC).

FIG. 6 illustrates a System-On-Chip (SOC) 2. SOC 2 includes digital blocks 6 and analog blocks 8 fabricated on a substrate 4. A synthesizer device 38 is also formed as a part of SOC 2. Interconnects 40 electrically couple digital blocks 6, analog blocks 8, and synthesizer block 38 together. Parasitics inherent in SOC 2 are known to cause undesirable signal cross-talk between different sections of SOC 2. Cross-talk in SOC 2 occurs through interactions between several parts of SOC 2 such as bond wires and metal lines. Electrical coupling between blocks 6, 8, and 38 on SOC 2 can also lead to signal cross-talk. Substrate 4 electrically acts as a resistor/capacitor network interconnecting all of the devices on SOC 2 together. Substrate 4 provides a medium through which noise and signals can propagate between blocks 6, 8, and 38. Through strategically surrounding circuit blocks 6, 8, and 38 each with a patterned buried layer 22, the transmission of electrical noise and signals between blocks 6, 8, and 38 is reduced. A low resistivity patterned layer 22 is fabricated on SOC 2 around each block 6, 8, and 38 as a ring. Buried layer 22 is formed beneath the surface of substrate 4 within the interior of substrate 4. Further, blocks 6 and 8 are formed within isolated P wells 12 and 16, N well 10, and deep N wells 20. The combination of buried layer 22 with wells 10, 12, 16, and 20 reduce the amount of electrical noise and signal cross-talk within SOC 2. As a result, the overall operation of SOC 2 is improved. To further enhance the reduction of electrical noise and signal cross-talk within SOC 2, trench 24 can be formed around blocks 6, 8, and 38 outside of buried layer 22. Trench 24, like buried layer 22, forms a ring around blocks 6, 8, and 38.

Figure 7:
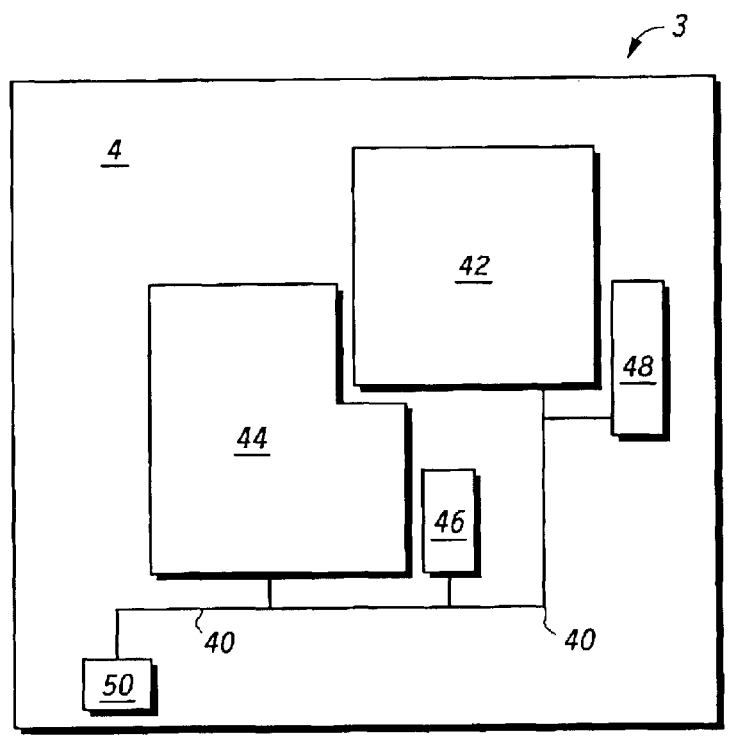
FIG. 7 illustrates another SOC.

FIG. 7 illustrates another SOC 3. In SOC 3, a digital core block 42 is placed next to a charge pump block 44. In addition, SOC 3 is provided with a oscillator block 46, a divider 48, and digital block 50. Charge pump blocks 44, like digital circuit blocks 6, produce significant amounts of electrical noise that can interfere with the operation of sensitive analog blocks 8. Oscillator block 46 and divider block 48 are placed within an isolated P well 12, P wells 16 and surrounded by a patterned low resistivity layer 22. Buried layer 22 forms a ring around each block 46 and 48 and is formed beneath the surface of substrate 4 within the interior of substrate 4. Digital core block 46 is positioned in isolated P well 16 and surrounded by a buried layer 22. Isolated P well 16 inhibits the ability of noise and signals produced by the circuitry in digital core 46 from propagating through substrate 4. To further enhance the reduction of electrical noise and signal cross-talk within SOC 3, trench 24 can be formed around blocks 42, 44, 46, and 48 outside of buried layer 22. Trench 24, like buried layer 22, forms a ring around blocks 42, 44, 46, and 48.

Although the present invention has been described in detail, it will be apparent to those of skill in the art that the invention may be embodied in a variety of specific forms and that various changes, substitutions, and alterations can be made without departing from the spirit and scope of the invention. The described embodiments are only illustrative and not restrictive and the scope of the invention is, therefore, indicated by the following claims.

We claim:

1. A process for reducing signal cross-talk in a System-On-Chip, comprising:

attenuating an electrical signal with a resistive substrate;

isolating a transistor circuit with a well region;

collecting said electrical signal propagating in said resistive substrate with a buried low resistance ring extending around said transistor circuit;

removing said electrical signal from said buried low resistance ring through a contact coupled to said buried low resistance ring; and isolating said transistor circuit from said resistive substrate with a dielectric layer formed between said transistor circuit and said substrate, thereby creating a Silicon-On-Insulator structure, wherein said buried low resistance ring is formed below said dielectric layer, and said contact extends through said dielectric layer to couple with said buried low resistance ring.

2. The process of claim 1, further comprising isolating said transistor circuit with a trench structure that forms a ring around said buried low resistance ring, thereby reducing signal cross-talk by increasing an inductance of said resistive substrate.

3. A process for reducing signal cross-talk in a System-On-Chip, comprising:

attenuating an electrical signal with a resistive substrate;

isolating a transistor circuit with a well region;

collecting said electrical signal propagating in said resistive substrate with a buried low resistance ring, extending around said transistor circuit;

removing said electrical signal from said buried low resistance ring through a contact coupled to said buried low resistance ring, wherein said well region is formed in direct contact with said resistive substrate.

4. A process for reducing signal cross-talk in a System-On-Chip, comprising:

forming a buried low resistance ring within a substrate, thereby defining a window;

forming a well region within the window defined by said buried low resistance ring;

forming a transistor within said well region above said buried low resistance ring; and forming a contact on said substrate coupled to said buried low resistance ring, whereby electrical signals that propagate through said substrate are collected by said buried low resistance ring and extracted from said substrate through said contact, further comprising the step of forming a dielectric layer between said transistor and said substrate, thereby forming a Silicon-On-Insulator structure, wherein said buried low resistance ring is formed below said dielectric layer.

5. The process of claim 4, further comprising the step of forming a ring shaped trench that surrounds said buried low resistance ring, thereby reducing signal cross-talk through increasing an inductance of said substrate.

6. The process of claim 4, wherein said well region is in direct contact with said substrate.

7. The process of claim 4, wherein said contact extends through said dielectric layer.

8. The process of claim 7, wherein said contact is formed in the shape of a ring surrounding said transistor.

9. The process of claim 7, wherein said buried low resistance ring extends completely down to a bottom surface of said substrate.

10. The process of claim 4, further comprising the step of providing a ring shaped trench that surrounds said buried low resistance ring, thereby reducing said current transient through increasing an inductance of said substrate.

11. A process for reducing the presence of a current transient within a System-On-Chip, comprising:

attenuating a current transient propagating between an analog transistor block and a digital transistor block with a resistive substrate;

isolating said analog transistor block within a well region;

collecting said current transient propagating through said resistive substrate with a low resistance region formed in the shape of a ring extending around said digital transistor block;

providing said current transient with a low resistance path out of said System-On-Chip from said buried low resistance ring through a contact coupled to said buried low resistance ring, and forming a dielectric layer between said digital transistor block and said substrate, thereby forming a Silicon-On-Insulator structure, wherein said low resistance region is formed below said dielectric layer, and said contact extends through said dielectric layer.

12. The process of claim 11, wherein said contact is formed in the shape of a ring surrounding said digital transistor block.

13. A process for reducing the presence of a current transient within a System-On-Chip, comprising:

attenuating a current transient propagating between an analog transistor block and a digital transistor block with a resistive substrate;

isolating said analog transistor block within a well region;

collecting said current transient propagating through said resistive substrate with a low resistance region formed in the shape of a ring extending around said digital transistor block; and providing said current transient with a low resistance path out of said System-On-Chip from said buried low resistance ring through a contact coupled to said buried low resistance ring; wherein said low resistance region extends completely down to a bottom surface of said substrate.

* * * * *

UNITED STATES PATENT AND TRADEMARK OFFICE
CERTIFICATE OF CORRECTION

PATENT NO. : 7,052,939 B2  Page 1 of 1
APPLICATION NO. : 10/304493
DATED : May 30, 2006
INVENTOR(S) : Wen Ling Margaret Huang et al.

It is certified that error appears in the above-identified patent and that said Letters Patent is hereby corrected as shown below:

In Column 9, Line 14, Claim No. 3:
 Change "buried low resistance ring," to --buried low resistance ring--

In Column 9, Line 18 and 19, Claim No. 3:
 Change "wherein said well region is formed in direct contact with said resistive substrate." to --wherein said buried low resistance ring extends completely down to a back surface of said resistive substrate.--

In Column 10, Line 21, Claim No. 11:
 Change "low resistance ring, and" to --low resistance ring; and--

In Column 10, Line 43, Claim No. 13:
 Change "low resistance ring; wherein said" to --low resistance ring, wherein said--

Signed and Sealed this

Seventeenth Day of June, 2008

JON W. DUDAS
*Director of the United States Patent and Trademark Office*